United States Patent
Mitsuya et al.

(10) Patent No.: US 12,184,204 B2
(45) Date of Patent: Dec. 31, 2024

(54) VIBRATION-DRIVEN ENERGY HARVESTING DEVICE

(71) Applicants: SAGINOMIYA SEISAKUSHO, INC., Tokyo (JP); KEIO UNIVERSITY, Tokyo (JP)

(72) Inventors: Hiroyuki Mitsuya, Sayama (JP); Hisayuki Ashizawa, Sayama (JP); Song-Ju Kim, Fujisawa (JP); Masashi Aono, Fujisawa (JP)

(73) Assignees: Saginomiya Seisakusho, Inc., Tokyo (JP); Keio University, Tokyo (JP)

(*) Notice: Subject to any disclaimer, the term of this patent is extended or adjusted under 35 U.S.C. 154(b) by 0 days.

(21) Appl. No.: 18/267,034

(22) PCT Filed: Dec. 17, 2021

(86) PCT No.: PCT/JP2021/046795
§ 371 (c)(1),
(2) Date: Jun. 13, 2023

(87) PCT Pub. No.: WO2022/131369
PCT Pub. Date: Jun. 23, 2022

(65) Prior Publication Data
US 2024/0056001 A1    Feb. 15, 2024

(30) Foreign Application Priority Data
Dec. 18, 2020 (JP) ................. 2020-210829

(51) Int. Cl.
*H02N 11/00* (2006.01)
(52) U.S. Cl.
CPC ................. *H02N 11/002* (2013.01)

(58) Field of Classification Search
CPC ................. H02N 11/00; H02N 11/002
See application file for complete search history.

(56) References Cited

U.S. PATENT DOCUMENTS

| | | |
|---|---|---|
| 2019/0028049 A1 | 1/2019 | Oonishi et al. |
| 2021/0226539 A1 | 7/2021 | Toshiyoshi et al. |

FOREIGN PATENT DOCUMENTS

| | | |
|---|---|---|
| CN | 107112924 A | 8/2017 |
| JP | 2019022409 A | 2/2019 |
| JP | 2019213295 A | 12/2019 |
| WO | 2020059723 A1 | 3/2020 |

OTHER PUBLICATIONS

International Preliminary Report on Patentability, PCT/JP2021/046795, Jun. 29, 2023.
EP 21906727.9, Extended European Search Report, Oct. 14, 2024.

*Primary Examiner* — Robert L Deberadinis
(74) *Attorney, Agent, or Firm* — The Webb Law Firm

(57) ABSTRACT

A vibration-driven energy harvesting device includes a vibration-driven energy harvesting element that generates power according to vibrations of an electrode; an output unit that, when connected to a load resistor, extracts power generated by the vibration-driven energy harvesting element; a judgment unit that judges whether or not a power value of the power is greater than a predetermined threshold value; a determination unit that determines an input impedance of the output unit based on a judgment result obtained by the judgment unit; and an adjustment unit that adjusts the input impedance of the output unit according to a determination made by the determination unit.

8 Claims, 6 Drawing Sheets

VIBRATION-DRIVEN ENERGY HARVESTING DEVICE

CROSS-REFERENCE TO RELATED APPLICATIONS

This application is the United States national phase of International Application No. PCT/JP2021/046795 filed Dec. 17, 2021, and claims priority to Japanese Patent Application No. 2020-210829 filed Dec. 18, 2020, the disclosures of which are hereby incorporated by reference in their entireties.

BACKGROUND OF THE INVENTION

Field of the Invention

The present invention relates to a vibration-driven energy harvesting device.

Description of Related Art

An decision making device described in Patent Literature 1 is known, and in the aforementioned Patent Literature 1 a vibration-driven energy harvesting device is disclosed in which a frequency at a time of extracting power is selected using the decision making device.

CITATION LIST

Patent Literature

Patent Literature 1: International Publication No. WO 2020/059723

SUMMARY OF INVENTION

Technical Problem

According to the vibration-driven energy harvesting device disclosed in Patent Literature 1, there is a problem that the efficiency of the extracted power is low in some cases.

Solution to Problem

According to one aspect of the present invention, a vibration-driven energy harvesting device includes: a vibration-driven energy harvesting element that generates power according to vibrations of an electrode; an output unit that, when connected to a load resistor, extracts power generated by the vibration-driven energy harvesting element; a judgment unit that judges whether or not a power value of the power is greater than a predetermined threshold value; a determination unit that determines an input impedance of the output unit based on a judgment result obtained by the judgment unit; and an adjustment unit that adjusts the input impedance of the output unit according to a determination made by the determination unit.

Advantageous Effect of Invention

According to the present invention, the power generation efficiency of a vibration-driven energy harvesting device can be increased in some cases.

DESCRIPTION OF THE INVENTION

Figure 1:
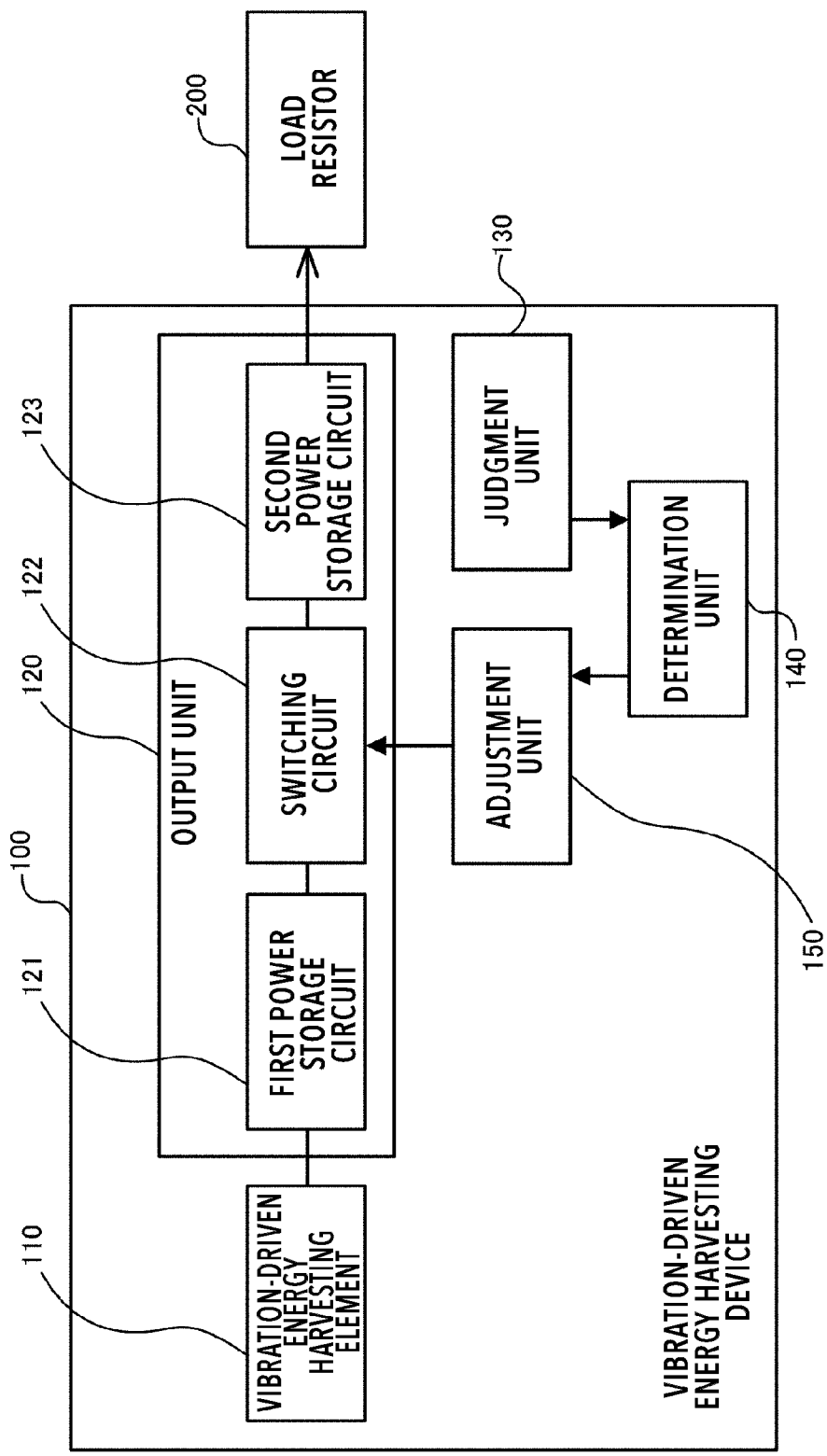
FIG. 1 is a view illustrating one example of the configuration of a vibration-driven energy harvesting device that is connected to a load resistor that is a power-supply object.

A vibration-driven energy harvesting device 100 according to one embodiment of the present invention will be described hereunder using FIG. 1 to FIG. 4C. FIG. 1 is a view that illustrates one example of the configuration of the vibration-driven energy harvesting device 100 that is connected to a load resistor 200 that is a power-supply object. The vibration-driven energy harvesting device 100 includes: a vibration-driven energy harvesting element 110 that generates power according to vibrations of an electrode; an output unit 120 that supplies power generated by the vibration-driven energy harvesting element 110 to the load resistor 200; a judgment unit 130; a determination unit 140; and an adjustment unit 150. The vibration-driven energy harvesting device 100 is installed in a vibration generation device, not illustrated in the drawings, that is a vibration source that causes an electrode of the vibration-driven energy harvesting element 110 to generate a vibration. The vibration-driven energy harvesting element 110 includes a fixed electrode and a movable electrode, and a vibration acceleration of the fixed electrode is a value in accordance with the vibration acceleration of the vibration generation device which is the vibration source. To facilitate understanding of the description, in the present embodiment it is assumed that the vibration acceleration of the fixed electrode of the vibration-driven energy harvesting element 110 is a value that is equal to the vibration acceleration of the vibration generation device. In FIG. 1, an arrow extending from the vibration-driven energy harvesting element 110 to the load resistor 200 via the output unit 120 indicates the power supply direction. Arrows extending from the judgment unit 130, the determination unit 140, and the adjustment unit 150, respectively, indicate directions of control for adjusting the input impedance of the output unit 120, which will be described later.

The judgment unit 130 is constituted of, for example, a comparator, and judges whether or not a power value of power supplied to the load resistor 200 by the output unit 120 is greater than a predetermined threshold value. The predetermined threshold value can be set to an arbitrary value by the determination unit 140. The determination unit 140 is constituted of, for example, a processor and a memory, and determines the input impedance of the output unit 120 based on a judgment result obtained by the judgment unit 130, by an operation in which the processor executes a computer program stored in the memory. The adjustment unit 150 includes a control circuit that controls a switching operation of a switching circuit 122, which will be described later, to adjust the input impedance of the output unit 120 according to the determination made by the determination unit 140.

The output unit 120 includes a first power storage circuit 121, the switching circuit 122, and a second power storage circuit 123. The first power storage circuit 121 is constituted of, for example, a rectifier and a capacitor, and converts alternating-current power that is output from the vibration-driven energy harvesting element 110 into direct-current power and stores the direct-current power. The switching circuit 122 is constituted of, for example, a transistor, and performs a switching operation to start or stop power transmission from the first power storage circuit 121 to the second power storage circuit 123. The second power storage circuit 123 is constituted of, for example, an inductor and a capacitor, and converts the voltage of direct-current power transmitted from the first power storage circuit 121 through the switching circuit 122 and stores the direct-current power.

Figure 2:
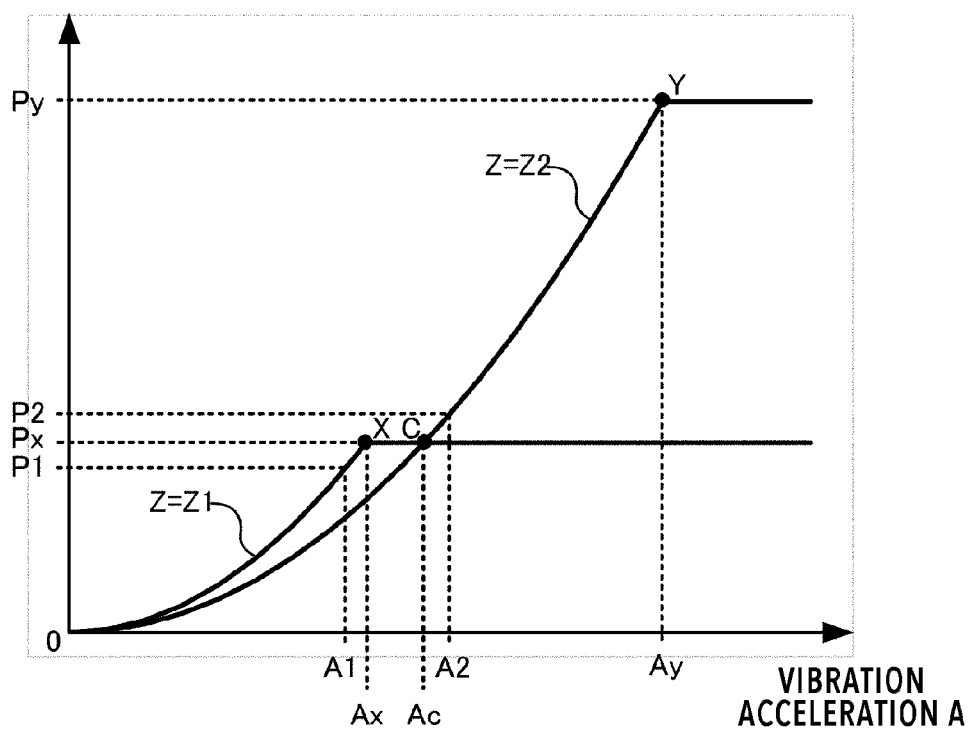
FIG. 2 is a view illustrating an example of a relation between a power value of power generated by a vibration-driven energy harvesting element, and a vibration acceleration of a vibration generation device that is a vibration source.

FIG. 2 is a view illustrating an example of the relation between a power value P of power generated by the vibration-driven energy harvesting element 110, and a vibration acceleration A of the vibration generation device that is a vibration source. When an input impedance Z of the output unit 120 is a first impedance value Z1, until the vibration acceleration A of the vibration generation device increases from 0 and reaches Ax, the power P generated by the vibration-driven energy harvesting element 110 increases in proportion to the square of the vibration acceleration A. That is, this relation is represented as shown in Equation (1) using a proportionality coefficient C1.

$$P = C1 \times A^2 \ (0 \le A \le Ax) \qquad (1)$$

When the input impedance Z of the output unit 120 is equal to Z1 (Z=Z1), based on Equation (1), when the vibration acceleration A of the vibration generation device is equal to Ax (A=Ax), the power P generated by the vibration-driven energy harvesting element 110 is equal to Px (P=Px), and an inflection point X (Ax, Px) can be represented in FIG. 2. When the vibration acceleration A becomes greater than Ax (A>Ax), the power P changes from a tendency exhibiting an increase in proportion to the square of the vibration acceleration A when the vibration acceleration A≤Ax, to a tendency such that, from the power value Px at the inflection point X, the power P is almost unchanged or exhibits a gradual increase or gradual decrease.

When the input impedance Z of the output unit 120 is a second impedance value Z2 that is different from the first impedance value Z1, until the vibration acceleration A of the vibration generation device increases from 0 and reaches Ay, the power P generated by the vibration-driven energy harvesting element 110 increases in proportion to the square of the vibration acceleration A. That is, this relation is represented as shown in Equation (2) using a proportionality coefficient C2.

$$P = C2 \times A^2 \ (0 \le A \le Ay) \qquad (2)$$

When the input impedance Z of the output unit 120 is equal to Z2 (Z=Z2), based on Equation (2), when the vibration acceleration A of the vibration generation device is equal to Ay (A=Ay), the power P generated by the vibration-driven energy harvesting element 110 is equal to Py (P=Py), and an inflection point y (Ay, Py) can be represented in FIG. 2. When the vibration acceleration A becomes greater than Ay (A>Ay), the power P changes from a tendency exhibiting an increase in proportion to the square of the vibration acceleration A when the vibration acceleration A≤Ay, to a tendency such that, from the power value Py at the inflection point Y, the power P is almost unchanged or exhibits a gradual increase or gradual decrease.

In a case where the second impedance value Z2 of the input impedance Z of the output unit 120 is greater than the first impedance value Z1, as illustrated in FIG. 2, the proportionality coefficient C2 used in Equation (2) is smaller than the proportionality coefficient C1 used in Equation (1), and the power value Py at the inflection point Y is greater than the power value Px at the inflection point X.

As illustrated in FIG. 2, when the vibration acceleration A of the vibration generation device is small, if the input impedance Z of the output unit 120 is adjusted to the first impedance value by the adjustment unit 150, a power P is obtained that is larger than a power P obtained when the input impedance Z of the output unit 120 is adjusted to the second impedance value. When the vibration acceleration A of the vibration generation device is large, if the input impedance Z of the output unit 120 is adjusted to the second impedance value by the adjustment unit 150, a power P is obtained that is larger than a power P obtained when the input impedance Z of the output unit 120 is adjusted to the first impedance value.

Focusing on this point, in the present embodiment, when the input impedance Z of the output unit 120 is the first impedance value Z1, when the power value of the power P generated by the vibration-driven energy harvesting element 110 increases accompanying an increase in the vibration acceleration A of the vibration generation device from 0 and, furthermore, becomes greater than the aforementioned predetermined threshold value, an index value X, which will be described later using FIG. 3, tends to increase. If it is judged that the index value X is not less than a predetermined value which will be described later, the adjustment unit 150 changes the input impedance Z of the output unit 120 from the first impedance value Z1 to the second impedance value Z2. Then, as the vibration acceleration A increases further, an even larger power P is obtained. Thereafter, conversely, if the power value of the power P generated by the vibration-driven energy harvesting element 110 decreases accompanying a decrease in the vibration acceleration A of the vibration generation device and, furthermore, becomes less than the aforementioned predetermined threshold value, the index value X tends to decrease. If it is judged that the index value X is less than a predetermined value which will be described later, the adjustment unit 150 changes the input impedance Z of the output unit 120 from the second impedance value Z2 to the first impedance value Z1. Then, even if the vibration acceleration A decreases further, a power P is obtained that is larger than in a case where it is assumed that the input impedance Z is not changed.

In the present embodiment it is assumed that the aforementioned predetermined threshold value is set to a first threshold value P1 shown in FIG. 2. Preferably, the first threshold value P1 is a value that is slightly smaller than the power value Px at the inflection point X shown in FIG. 2, corresponding to a power value with respect to an acceleration A1 when the input impedance Z of the output unit 120 is equal to Z1 (Z=Z1). When the first threshold value P1 is set to a value that is close to the power value Px, within a range $0 \le A \le Ax$ of the vibration acceleration A, there is a higher tendency for the input impedance Z of the output unit 120 to be determined as the first impedance value Z1 by the aforementioned operation, and the possibility that a higher power P than when the input impedance Z is the second impedance value Z2 can be obtained increases. On the other hand, by setting the first threshold value P1 to a value that is not too close to the power value Px, the possibility of the input impedance Z being changed from the first impedance value Z1 to the second impedance value Z2 by the aforementioned operation can be ensured. Therefore, the first threshold value P1 is a value which is as close as possible to the power value Px without, however, being too close to the power value Px, and for example is a value that is about 90% of the power value Px.

Note that, setting of the predetermined threshold value to the first threshold value P1 is performed by the determination unit 140 as mentioned above, and judging whether or not the power value of the power P generated by the vibration-driven energy harvesting element 110 is greater than a predetermined threshold value is performed by the judgment unit 130 as mentioned above. The input impedance Z that is changed by the adjustment unit 150 is determined by the determination unit 140 based on the judgment result of the judgment unit 130 as mentioned above.

Figure 3:
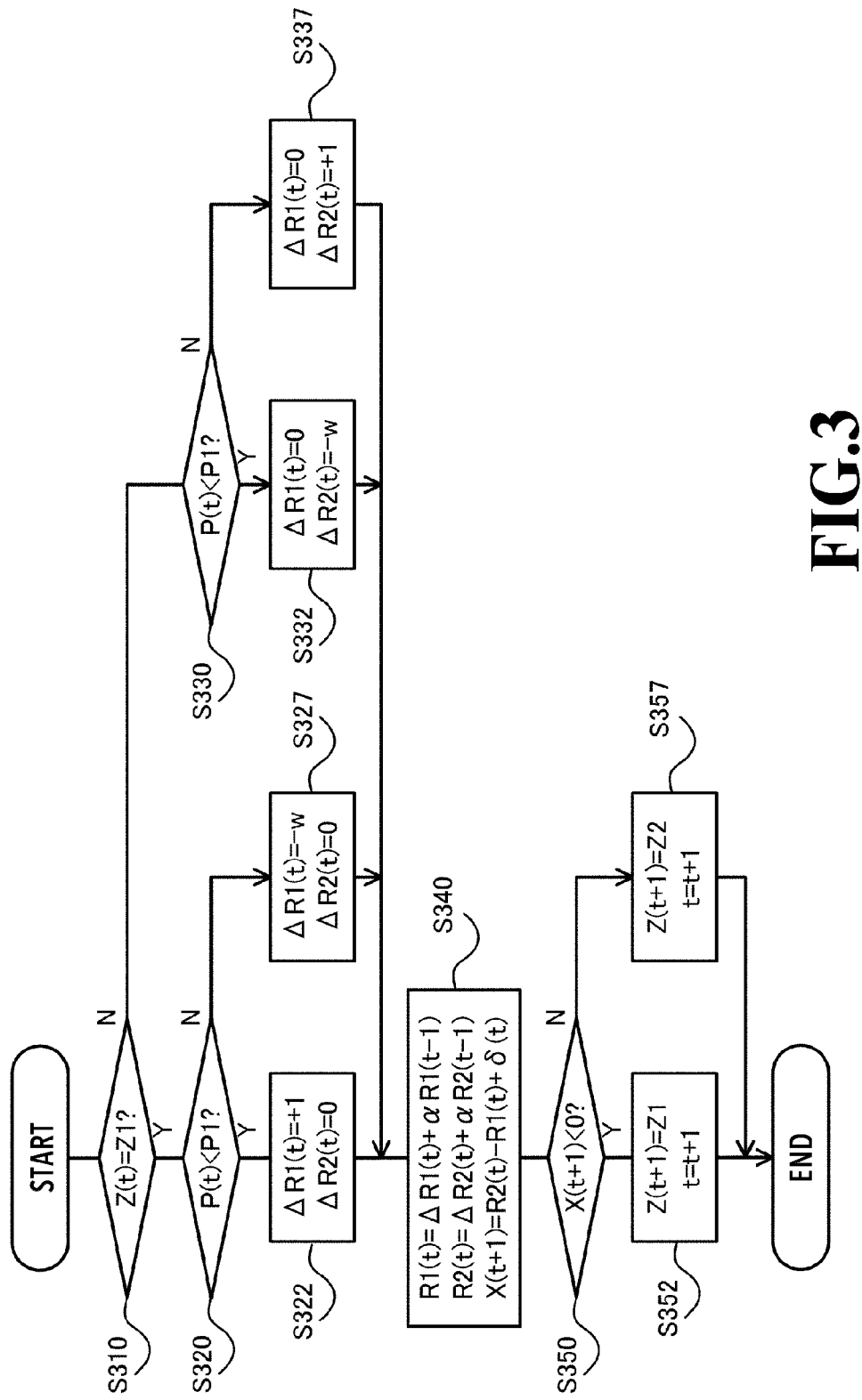
FIG. 3 is a view illustrating an example of processing for determining an input impedance of an output unit of the vibration-driven energy harvesting device that is performed by a determination unit of the vibration-driven energy harvesting device.

FIG. 3 is a view illustrating an example of processing for determining the input impedance Z of the output unit 120 of the vibration-driven energy harvesting device 100, which is performed by the determination unit 140 of the vibration-driven energy harvesting device 100. The processor of the determination unit 140 executes a computer program stored in the memory to perform the processing in step S310 and each step thereafter as shown in FIG. 3. A tug-of-war (TOW) model disclosed in the aforementioned Patent Literature 1 is used for the processing shown in FIG. 3. In the present embodiment, when the processing of the final step shown in FIG. 3 ends at a time t that is a first timing, the time t is replaced with a time (t+1) that is a second timing which is later than the first timing, and the processing of each step is performed again starting from step S310 at the second timing.

In step S310, the determination unit 140 judges whether the input impedance Z(t) of the output unit 120 at the time t is the first impedance value Z1. In a case where an affirmative judgment is obtained, the input impedance Z(t) of the output unit 120 at the time t is the first impedance value Z1, and the process proceeds to step S320 that corresponds to the first impedance value Z1. In a case where a negative judgment is obtained, the input impedance Z(t) of the output unit 120 at the time t is the second impedance value Z2 that is different from the first impedance value Z1, and the process proceeds to step S330 that corresponds to the second impedance value Z2.

In step S320, the determination unit 140 judges whether a power value P(t) of the power P generated by the vibration-driven energy harvesting element 110 at the time t is smaller than the first threshold value P1 set as the predetermined threshold value. If an affirmative judgment is obtained in step S320, that is, in a case where it is judged that the power value P(t) is smaller than the first threshold value P1, in step S322 the determination unit 140 sets a first change amount as a change amount $\Delta R1(t)$ at the time t with respect to a first calculation value R1(t), which will be described later. In the present embodiment, the first change amount is 1, that is, $\Delta R1(t)=1$. At this time, the determination unit 140 sets 0 as a change amount $\Delta R2(t)$ at the time t with respect to a second calculation value R2(t) which will be described later. If a negative judgment is obtained in step S320, that is, in a case where it is judged that the power value P(t) is not smaller than the first threshold value P1, in step S327 the determination unit 140 sets a negative value of a second change amount as the change amount $\Delta R1(t)$ at the time t. In the present embodiment, the second change amount is represented by w, that is, $\Delta R1(t)=-w$. At this time, the determination unit 140 sets 0 as the change amount $\Delta R2(t)$ at the time t. Upon the processing in step S322 or S327 being completed, the process proceeds to step S340.

In step S330, the determination unit 140 judges whether the power value P(t) of the power P generated by the vibration-driven energy harvesting element 110 at the time t is smaller than the first threshold value P1 set as the predetermined threshold value. If an affirmative judgment is obtained in step S330, that is, in a case where it is judged that the power value P(t) is smaller than the first threshold value P1, in step S332 the determination unit 140 sets a negative value of the second change amount as the change amount $\Delta R2(t)$ at the time t. In the present embodiment, as mentioned above, the second change amount is represented by w, that is, $\Delta R2(t)=-w$. At this time, the determination unit 140 sets 0 as the change amount $\Delta R1(t)$ at the time t. If a negative judgment is obtained in step S330, that is, in a case where it is judged that the power value P(t) is not smaller than the first threshold value P1, in step S337 the determination unit 140 sets the first change amount as the change amount $\Delta R2(t)$ at the time t. In the present embodiment, as mentioned above, the first change amount is 1, that is, $\Delta R2(t)=1$. At this time, the determination unit 140 sets 0 as the change amount $\Delta R1(t)$ at the time t. Upon the processing in step S332 or S337 being completed, the process proceeds to step S340.

In step S340, the determination unit 140 calculates a first calculation value R1(t) and a second calculation value R2(t) which is different from the first calculation value R1(t) at the time t, and based on a difference obtained by subtracting the first calculation value R1(t) from the second calculation value R2(t) at the time t, calculates an index value X(t+1) at a time (t+1) as shown in Equation (3). The index value X(t+1) represents an index for determining either one of the first impedance value Z1 and the second impedance value Z2 as an input impedance Z(t+1) of the output unit 120 at the time (t+1). Note that, in Equation (3), a value that takes into account fluctuations including noise and errors occurring in the vibration-driven energy harvesting device 100 at the time t is set as a correction amount $\delta(t)$.

$$X(t+1)=R2(t)-R1(t)+\delta(t) \tag{3}$$

The first calculation value R1(*t*) and the second calculation value R2(*t*) at the time t that are calculated by the determination unit 140 in step S340 are shown in Equations (4) and (5). That is, the first calculation value R1(*t*) and the second calculation value R2(*t*) at the time t are represented, using a proportionality coefficient $\alpha$, based on a first proportional value $\alpha$R1(*t*−1) and a second proportional value $\alpha$R2(*t*−1) that are proportional, respectively, to a first calculation value R1(*t*−1) and a second calculation value R2(*t*−1) calculated at a time (t−1) prior to the first timing corresponding to the time t, and the aforementioned change amount $\Delta$R1(*t*) and change amount $\Delta$R2(*t*). Note that, as mentioned above, based on the judgment processing in step S310, step S320 that corresponds to the first impedance value Z1 or step S330 that corresponds to the second impedance value Z2 is performed. Based on the respective results, the change amount $\Delta$R1(*t*) that corresponds to the first impedance value Z1 or the change amount $\Delta$R2(*t*) that corresponds to the second impedance value Z2 is obtained. Therefore, the first calculation value R1(*t*) expressed by Equation (4) is a calculation value that corresponds to the first impedance value Z1, and the second calculation value R2(*t*) expressed by Equation (5) is a calculation value that corresponds to the second impedance value Z2.

$$R1(t)=\Delta R1(t)+\alpha R1(t-1) \tag{4}$$

$$R2(t)=\Delta R2(t)+\alpha R2(t-1) \tag{5}$$

The processing that is performed when, at the time t, the input impedance Z of the output unit 120 is the first impedance value Z1, that is, when an affirmative judgment is obtained in step S310, will now be described. First, the processing that is performed in a case where the judgment unit 130 judges that the power value P(t) of the power P generated by the vibration-driven energy harvesting element 110 is smaller than the first threshold value P1 that is the predetermined threshold value, that is, when an affirmative judgment is obtained in step S320 will be described. In this case, the first calculation value R1(*t*) and the second calculation value R2(*t*) are calculated as follows using Equations (4) and (5). The first calculation value R1(*t*) at the time t is obtained by 1 that is the aforementioned first change amount being added to the first proportional value $\alpha$R1(*t*−1) calculated at the time (t−1). Further, the second calculation value R2(*t*) at the time t is obtained as a value that is equal to the second proportional value $\alpha$R2(t−1) calculated at the time (t−1).

The processing performed in a case where, at the time t, the input impedance Z of the output unit 120 is the first impedance value Z1, and it is judged by the judgment unit 130 that the power value P(t) of the power P generated by the vibration-driven energy harvesting element 110 is not smaller than the first threshold value P1 that is the predetermined threshold value, that is, when a negative judgment is obtained in step S320 will now be described. In this case, the first calculation value R1(*t*) and the second calculation value R2(*t*) are calculated as follows using Equations (4) and (5). The first calculation value R1(*t*) at the time t is obtained by w that is the aforementioned second change amount being subtracted from the first proportional value $\alpha$R1(*t*−1) calculated at the time (t−1). Further, the second calculation value R2(*t*) at the time t is obtained as a value that is equal to the second proportional value $\alpha$R2(*t*−1) calculated at the time (t−1).

The processing performed when, at the time t, the input impedance Z of the output unit 120 is the second impedance value Z2 that is different from the first impedance value Z1, that is, when a negative judgment is obtained in step S310, will now be described. First, in a case where the judgment unit 130 judges that the power value P(t) of the power P generated by the vibration-driven energy harvesting element 110 is smaller than the first threshold value P1 that is the predetermined threshold value, that is, when an affirmative judgment is obtained in step S330 will be described. In this case, the first calculation value R1(*t*) and the second calculation value R2(*t*) are calculated as follows using Equation (4) and (5). The second calculation value R2(*t*) at the time t is obtained by w that is the aforementioned second change amount being subtracted from the second proportional value $\alpha$R2(*t*−1) calculated at the time (t−1). Further, the first calculation value R1(*t*) at the time t is obtained as a value that is equal to the first proportional value $\alpha$R1(*t*−1) calculated at the time (t−1).

The processing performed in a case where, at the time t, the input impedance Z of the output unit 120 is the second impedance value Z2 that is different from the first impedance value Z1, and it is judged by the judgment unit 130 that the power value P(t) of the power P generated by the vibration-driven energy harvesting element 110 is not smaller than the first threshold value P1 that is the predetermined threshold value, that is, when a negative judgment is obtained in step S330 will now be described. In this case, the first calculation value R1(*t*) and the second calculation value R2(*t*) are calculated as follows using Equations (4) and (5). The second calculation value R2(*t*) at the time t is obtained by 1 that is the aforementioned first change amount being added to the second proportional value $\alpha$R2(*t*−1) calculated at the time (t−1). Further, the first calculation value R1(*t*) at the time t is obtained as a value that is equal to the first proportional value $\alpha$R1(*t*−1) calculated at the time (t−1).

In step S350, the determination unit 140 judges whether the index value X(t+1) at the time (t+1) obtained in step S340 is less than a predetermined value. Preferably, 0 is set as the predetermined value. Accordingly, in a case where the index value X(t+1) is less than 0, the result of the judgment is affirmative, and in a case where the index value X(t+1) is not less than 0, the result of the judgment is negative. If an affirmative judgment is obtained the process proceeds to step S352, and if a negative judgment is obtained the process proceeds to step S357.

In step S352, the determination unit 140 determines the first impedance value Z1 as the input impedance Z(t+1) of the output unit 120 at the time (t+1). Thereafter, after the time t is replaced with the time (t+1) that is the second timing as described above, the processing for determining the input impedance Z at the first timing ends, and processing for determining the input impedance Z at the second timing starts once more.

In step S357, the determination unit 140 determines the second impedance value Z2 as the input impedance Z(t+1) of the output unit 120 at the time (t+1). Thereafter, after the time t is replaced with the time (t+1) that is the second timing as described above, the processing for determining the input impedance Z at the first timing ends, and processing for determining the input impedance Z at the second timing starts once more.

Note that, although the value w of the second change amount described above is, for example, a fixed value of 1, it may be a value other than 1, and need not be a fixed value. A configuration may be adopted in which the value w of the second change amount is obtained according to a probability that a judgment result that is either one of affirmative and negative will be obtained in steps S320 and S330 at the next time (t+1), when either one of the first impedance value Z1 and the second impedance value Z2 is selected as the input impedance Z in steps S352 and S357 at the time t. In addition, in a case where the value w of the second change amount is a fixed value, a configuration may be adopted so that the correction amount δ(t) is 0.

Further, the value of the proportionality coefficient α used in Equations (4) and (5) as described above is 0 or more and 1 or less (0≤α≤1), and is defined according to the degree to which the influence of past calculated values is to be taken into consideration. If it is possible to appropriately set the input impedance Z of the output unit 120 by taking into consideration only the relatively immediately preceding influence, it suffices that the value of the proportionality coefficient α may be small.

Figure 4A:
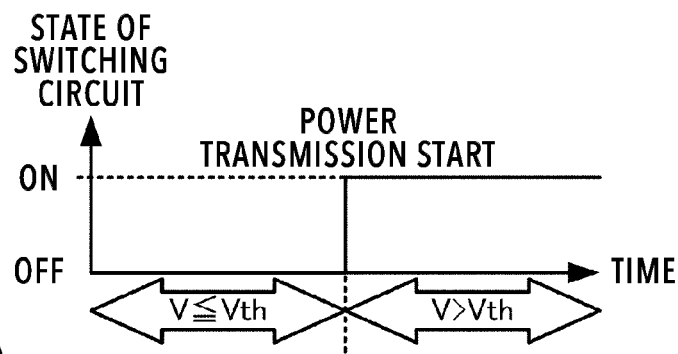
FIG. 4A is a view for describing an example of processing for adjusting the input impedance of the output unit of the vibration-driven energy harvesting device that is performed by an adjustment unit of the vibration-driven energy harvesting device.
Figure 4B:
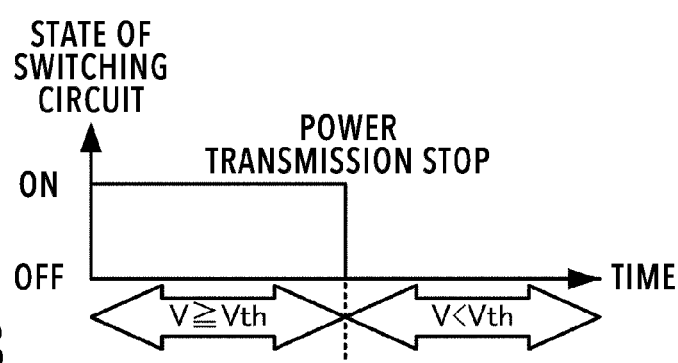
FIG. 4B is a view for describing an example of processing for adjusting the input impedance of the output unit of the vibration-driven energy harvesting device that is performed by the adjustment unit of the vibration-driven energy harvesting device.
Figure 4C:
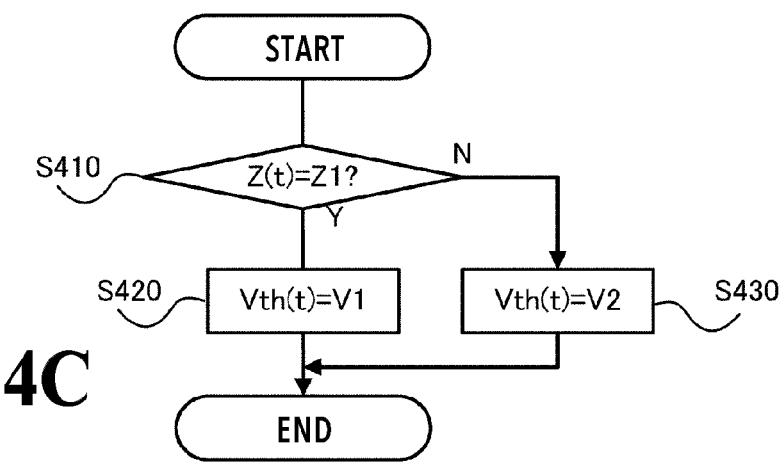
FIG. 4C is a view for describing an example of processing for adjusting the input impedance of the output unit of the vibration-driven energy harvesting device that is performed by the adjustment unit of the vibration-driven energy harvesting device.

FIG. 4A to FIG. 4C are views for describing one example of processing that adjusts the input impedance Z of the output unit 120 of the vibration-driven energy harvesting device 100, which is performed by the adjustment unit 150 of the vibration-driven energy harvesting device 100. As described above, the adjustment unit 150 includes a control circuit that controls a switching operation of the switching circuit 122. As illustrated in FIG. 4A, when a voltage V of direct-current power stored in the first power storage circuit 121 rises to a voltage value that is more than a predetermined voltage value Vth (V>Vth), in accordance with control by the adjustment unit 150, the switching circuit 122 performs a switching operation with respect to the power transmission. The state of the switching circuit 122 changes from OFF to ON, and power transmission from the first power storage circuit 121 to the second power storage circuit 123 is started. As illustrated in FIG. 4B, when the voltage V of the direct-current power stored in the first power storage circuit 121 decreases to a voltage value that is less than the predetermined voltage value Vth (V<Vth), in accordance with control by the adjustment unit 150, the switching circuit 122 performs a switching operation with respect to the power transmission. The state of the switching circuit 122 changes from ON to OFF, and the power transmission from the first power storage circuit 121 to the second power storage circuit 123 is stopped.

The adjustment unit 150 changes the condition under which a switching operation with respect to the power transmission is performed by the switching circuit 122, according to the determination regarding the input impedance Z made by the determination unit 140 described above using FIG. 3. In the present embodiment, by changing the predetermined voltage value Vth described above, the adjustment unit 150 changes the condition under which the switching operation with respect to the power transmission is performed by the switching circuit 122, and adjusts the input impedance Z of the output unit 120 by changing that condition according to the determination regarding the input impedance Z made by the determination unit 140. Such processing for adjusting the input impedance Z that is performed by the adjustment unit 150 is illustrated in FIG. 4C.

The processing for adjusting the input impedance Z which is performed by the adjustment unit 150 that is shown in FIG. 4C is started at the time t at which the input impedance Z(t) is determined by the determination unit 140. In step S410, the adjustment unit 150 judges whether or not the input impedance Z(t) determined by the determination unit 140 is the first impedance value Z1. If an affirmative judgment is obtained, the process proceeds to step S420, while if a negative judgment is obtained, the process proceeds to step S430.

In step S420, the adjustment unit 150 sets the predetermined voltage value Vth(t) at the time t to a first voltage value V1. When the predetermined voltage value Vth(t)=V1, the input impedance Z(t) of the output unit 120 becomes the first impedance value Z1. When step S420 is completed, the adjustment processing with respect to the input impedance Z at the time t ends.

In step S430, the adjustment unit 150 sets the predetermined voltage value Vth(t) at the time t to a second voltage value V2 that is greater than the first voltage value V1. When the predetermined voltage value Vth(t)=V2, the input impedance Z(t) of the output unit 120 becomes the second impedance value Z2. When step S430 is completed, the adjustment processing with respect to the input impedance Z at the time t ends.

According to the vibration-driven energy harvesting device 100 of the present embodiment, the following operational advantages are obtained.

(1) The vibration-driven energy harvesting device 100 includes: the vibration-driven energy harvesting element 110 that generates power according to vibrations of an electrode; the output unit 120 that, when connected to the load resistor 200, extracts power generated by the vibration-driven energy harvesting element 110; the judgment unit 130; the determination unit 140; and the adjustment unit 150. The judgment unit 130 judges whether or not a power value of power P generated by the vibration-driven energy harvesting element 110 is greater than a first threshold value P1 that is a predetermined threshold value. The determination unit 140 determines an input impedance Z of the output unit 120 based on a judgment result obtained by the judgment unit 130. The adjustment unit 150 adjusts the input impedance Z of the output unit 120 according to the determination made by the determination unit 140. Therefore, an advantageous effect is obtained that it is possible to change the power P extracted by the output unit 120 of the vibration-driven energy harvesting device 100 according to the input impedance Z, and hence the power generation efficiency of the vibration-driven energy harvesting device 100 can be increased in some cases.

(2) In the vibration-driven energy harvesting device 100, the determination unit 140 determines either one of the first impedance value Z1 and the second impedance value Z2 that is different from the first impedance value Z1 as the input impedance Z of the output unit 120, according to an index value X that is calculated based on the judgment result obtained by the judgment unit 130. Based on a judgment result obtained by the judgment unit 130 at a time t that is a first timing, and a judgment result obtained by the judgment unit 130 at a time (t−1) that is prior to the first timing, the determination unit 140 calculates an index value X(t+1) at a time (t+1) that is a second timing that is later than the first timing. Therefore, an advantageous effect is obtained that the power P is stably extracted by the output unit 120 of the vibration-driven energy harvesting device 100 without being affected by temporary voltage fluctuations.

(3) In the vibration-driven energy harvesting device 100, the determination unit 140 calculates the first calculation value R1(*t*) corresponding to the first impedance value Z1, and the second calculation value R2(*t*) corresponding to the second impedance value Z2 based on the judgment result obtained by the judgment unit 130. The determination unit 140 calculates the index value X(t+1) at the time (t+1) that is the second timing based on a difference obtained by subtracting the first calculation value R1(*t*) at the time t that is the first timing from the second calculation value R2(*t*) at the time t that is the first timing. The correction amount δ(t) is taken into consideration when calculating the index value X(t+1). In a case where the index value X(t+1) is less than 0 that is a predetermined value, the determination unit 140 determines the first impedance value Z1 as the input impedance Z(t+1) of the output unit 120, and in a case where the index value X(t+1) is greater than 0 that is the predetermined value, the determination unit 140 determines the second impedance value Z2 as the input impedance Z(t+1) of the output unit 120. Therefore, an advantageous effect is obtained that a choice for which the possibility is higher is determined through a tug-of-war (TOW) between a possibility that the first impedance value Z1 will be selected as the input impedance Z of the output unit 120 and a possibility that the second impedance value Z2 will be selected as the input impedance Z of the output unit 120.

(4) In the vibration-driven energy harvesting device 100, when the input impedance Z(t) of the output unit 120 at the time t that is the first timing is the first impedance value Z1, in a case where the judgment unit 130 judges that the power value of the power P that the output unit 120 extracts is smaller than the first threshold value P1 that is the predetermined threshold value, the first calculation value R1(*t*) at the time t that is the first timing is obtained by 1 that is a first change amount being added to a first proportional value αR1(*t*−1) that is proportional to the first calculation value R1(*t*−1) calculated at the time (t−1) which is prior to the first timing. In a case where the judgment unit 130 judges that the power value of the power P that the output unit 120 extracts is greater than the first threshold value P1 that is the predetermined threshold value, the first calculation value R1(*t*) at the time t that is the first timing is obtained by w that is a second change amount being subtracted from the first proportional value αR1(*t*−1) that is proportional to the first calculation value R1(*t*−1) calculated at the time (t−1) which is prior to the first timing.

When the input impedance Z(t) of the output unit 120 at the time t that is the first timing is the second impedance value Z2 that is different from the first impedance value Z1, in a case where the judgment unit 130 judges that the power value of the power P that the output unit 120 extracts is greater than the first threshold value P1 that is the predetermined threshold value, the second calculation value R2(*t*) at the time t that is the first timing is obtained by 1 that is the first change amount being added to a second proportional value αR2(*t*−1) that is proportional to the second calculation value R2(*t*−1) calculated at the time (t−1) which is prior to the first timing, and in a case where the judgment unit 130 judges that the power value of the power P that the output unit 120 extracts is smaller than the first threshold value P1 that is the predetermined threshold value, the second calculation value R2(*t*) at the time t that is the first timing is obtained by w that is the second change amount being subtracted from the second proportional value αR2(*t*−1) that is proportional to the second calculation value R2(*t*−1) calculated at the time (t−1) which is prior to the first timing. Therefore, an advantageous effect is obtained that, by setting w that is the second change amount to an appropriate value based on experimentation, the power P that has high efficiency can be stably extracted by the output unit 120.

(5) In the vibration-driven energy harvesting device 100, the output unit 120 includes: the first power storage circuit 121 that converts alternating-current power which is output from the vibration-driven energy harvesting element 110 into direct-current power and stores the direct-current power; the second power storage circuit 123 that converts the voltage of the direct-current power and stores the direct-current power; and the switching circuit 122 that performs a switching operation that starts or stops power transmission from the first power storage circuit 121 to the second power storage circuit 123. The adjustment unit 150 adjusts the input impedance Z of the output unit 120 by changing a condition under which the switching operation with respect to power transmission that is controlled by a control circuit included in the adjustment unit 150 is performed. An advantageous effect is obtained that it is possible to adjust the input impedance Z of the output unit 120 without requiring any special change to be made to the circuitry of a conventional output unit 120.

(6) In the vibration-driven energy harvesting device 100, when a voltage V of the direct-current power stored in the first power storage circuit 121 increases to a voltage value that is more than a predetermined voltage value Vth or decreases to a voltage value that is lower than the predetermined voltage value Vth, the switching circuit 122 performs the switching operation with respect to the power transmission. The control circuit included in the adjustment unit 150 can change the condition under which the switching operation with respect to the power transmission is performed by the switching circuit 122, by changing the predetermined voltage value Vth. In this case, an advantageous effect is obtained that the control circuit can be composed of a comparatively simple circuit.

The following modifications also come within the scope of the present invention, and it is also possible to combine one or a plurality of the modifications described hereunder with the embodiment described above.

(1) In the embodiment described above, a configuration is adopted in which only the first threshold value P1 is used as a predetermined threshold value when the judgment unit 130 of the vibration-driven energy harvesting device 100 judges whether or not the power value of the power P generated by the vibration-driven energy harvesting element 110 is greater than the predetermined threshold value. However, a configuration may be adopted in which a plurality of kinds of threshold values, and not only the first threshold value P1, are used as predetermined threshold values. The number of kinds of threshold values used as predetermined threshold values is, for example, made a number that is equal to the number of kinds of impedance values that can be set as the input impedance Z of the output unit 120. In a case where the first impedance value Z1 or the second impedance value Z2 can be set as the input impedance Z of the output unit 120, a configuration may be adopted in which, as predetermined threshold values, a second threshold value P2 that corresponds to the second impedance value Z2 is used together with the first threshold value P1 that corresponds to the first impedance value Z1. The second threshold value P2 is determined by the determination unit 140, similarly to the first threshold value P1.

A second threshold value which is used together with the first threshold value P1 as a predetermined threshold value will now be described using FIG. 2. A state when the vibration acceleration A of the vibration generation device is small is taken as an initial state, and it is assumed that in this initial state the input impedance Z of the output unit 120 is adjusted to the first impedance value by the adjustment unit 150. When the power value of the power P generated by the vibration-driven energy harvesting element 110 increases accompanying an increase in the vibration acceleration A from 0 and, furthermore, becomes greater than the first threshold value P1 that is a predetermined threshold value, the index value X tends to increase. If it is judged that the index value X is not less than the predetermined value, the adjustment unit 150 changes the input impedance Z of the output unit 120 from the first impedance value Z1 to the second impedance value Z2. Then, as the vibration acceleration A increases further, an even larger power P is obtained. Thereafter, conversely, if the power value of the power P generated by the vibration-driven energy harvesting element 110 decreases accompanying a decrease in the vibration acceleration A and, furthermore, becomes less than a second threshold value P2 that is a predetermined threshold value that is not the first threshold value P1, the index value X tends to decrease. If it is judged that the index value X is less than the predetermined value, the adjustment unit 150 changes the input impedance Z of the output unit 120 from the second impedance value Z2 to the first impedance value Z1. Then, even if the vibration acceleration A decreases further, a power P is obtained that is larger than in a case where it is assumed that the input impedance Z is not changed.

The second threshold value P2 corresponds to a power value with respect to an acceleration A2 when the input impedance Z of the output unit 120=Z2, and preferably is a value that is somewhat larger than the power value Px at the inflection point X shown in FIG. 2. In FIG. 2, the vibration acceleration A corresponding to the power value Px at an intersection point C between the graph of the power P when the input impedance Z of the output unit 120=Z1 and the graph of the power P when the input impedance Z of the output unit 120=Z2 is defined as being equal to Ac (A=Ac). When the second threshold value P2 is set to a value that is greater than the power value Px, in a case where the value of the vibration acceleration A when the input impedance Z=Z2 is lower than Ac (A<Ac), by the aforementioned operation, there is a higher tendency for the first impedance value Z1 to be determined as the input impedance Z of the output unit 120, and the possibility that a higher power P will be obtained than when the input impedance Z is the second impedance value Z2 increases. By the second threshold value P2 being greater than the power value Px, the possibility that an unfavorable operation in which the second impedance value Z2 is determined as the input impedance Z of the output unit 120 even though a larger power P will be obtained if the first impedance value Z1 is determined as the input impedance Z of the output unit 120 can be prevented increases.

Although, as mentioned above, the second threshold value P2 is greater than the power value Px, preferably the second threshold value P2 is not too large. If the second threshold value P2 (P2>Px) is set to a value that is close to the power value Px, within a range of the vibration acceleration A in which A>Ac, the tendency that, by the aforementioned operation, the second impedance value Z2 will be determined as the input impedance Z of the output unit 120 becomes stronger, and the possibility that a higher power P will be obtained than when the input impedance Z is the first impedance value Z1 increases.

Figure 5:
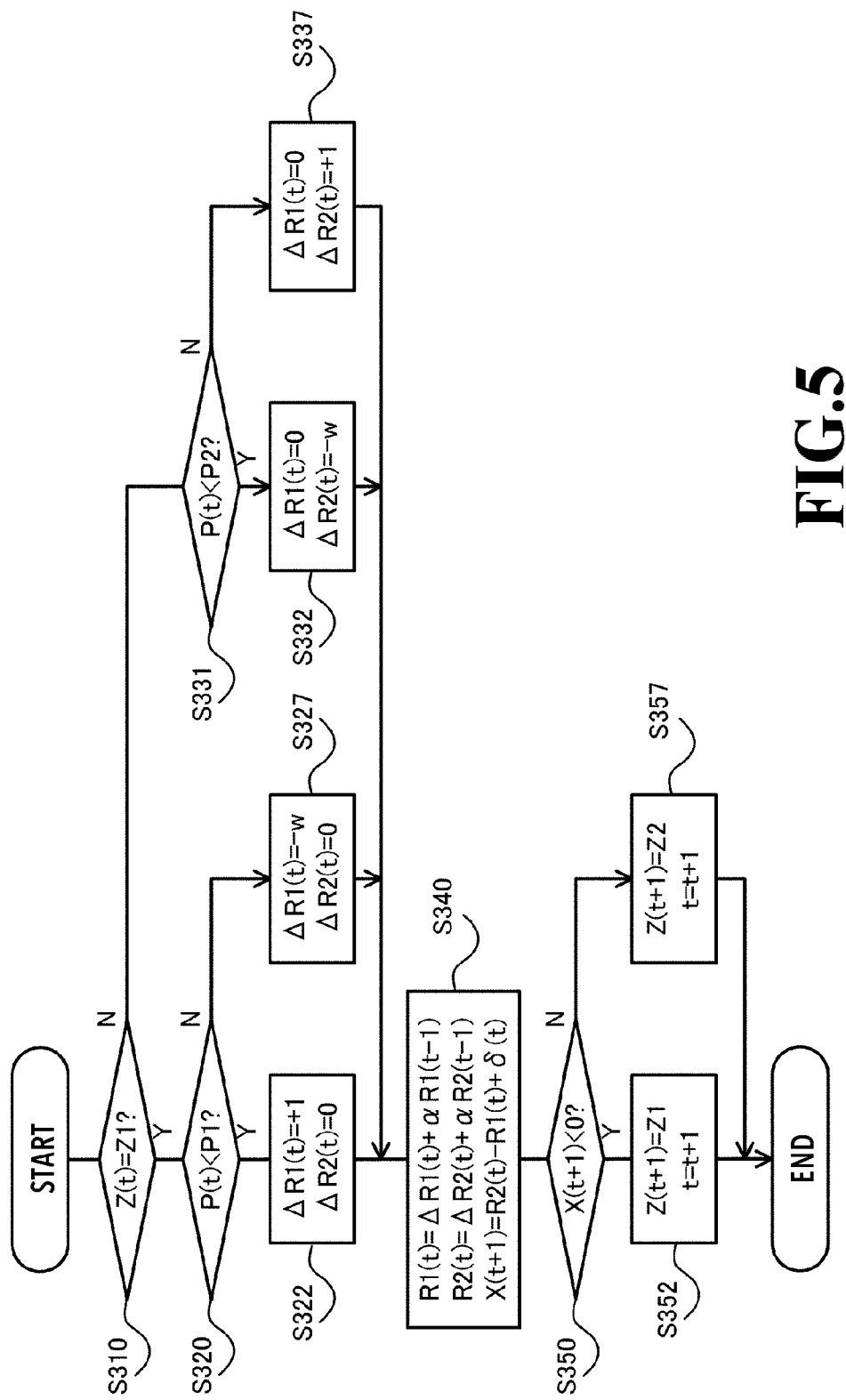
FIG. 5 is a view illustrating another example of processing for determining the input impedance of the output unit of the vibration-driven energy harvesting device that is performed by the determination unit of the vibration-driven energy harvesting device.

FIG. 5 is a view illustrating another example of processing for determining the input impedance Z of the output unit 120 of the vibration-driven energy harvesting device 100, that is performed by the determination unit 140 of the vibration-driven energy harvesting device 100. This input impedance determination processing is performed by the determination unit 140 of the vibration-driven energy harvesting device 100 in the present modification. The difference between FIG. 5 and FIG. 3 which shows input impedance determination processing performed by the determination unit 140 of the vibration-driven energy harvesting device 100 in the embodiment described above is that the processing in step S331 in FIG. 5 is performed instead of the processing in step S330 in FIG. 3. In step S331, the determination unit 140 judges whether a power value P(t) of the power P generated by the vibration-driven energy harvesting element 110 at the time t is smaller than the second threshold value P2 set as a predetermined threshold value. If an affirmative judgment is obtained, that is, if it is judged that the power value P(t) is smaller than the second threshold value P2, the process proceeds to step S332, while if a negative judgment is obtained, that is, if it is judged that the power value P(t) is not smaller than the second threshold value P2, the process proceeds to step S337.

In the vibration-driven energy harvesting device 100 according to the present modification, when the input impedance Z is the first impedance value Z1, the predetermined threshold value that is used for a judgment made by the judgment unit 130 is the first threshold value P1, and when the input impedance Z is the second impedance value Z2, the predetermined threshold value is the second threshold value P2 that is different from the first threshold value P1. At a time that the input impedance Z is the first impedance value Z1, a specific power value Px corresponding to an inflection point X where an increase in the power value of the power P according to an acceleration of vibrations of an electrode which the vibration-driven energy harvesting element 110 includes slows down is greater than the first threshold value P1 and is less than the second threshold value P2. Therefore, an advantageous effect is obtained such that there is a possibility that, when the input impedance Z is the second impedance value Z2, at a time that the value of the vibration acceleration A decreases, the power P which is generated by the vibration-driven energy harvesting element 110 and output by the output unit 120 of the vibration-driven energy harvesting device 100 will be increased further. Note that, in the present modification, it is assumed that the acceleration of vibrations of a fixed electrode which the vibration-driven energy harvesting element 110 includes is a value that is equal to the vibration acceleration of the vibration generation device that is the vibration source.

(2) In the embodiment described above, a configuration is adopted in which two kinds of impedance values, namely, the first impedance value Z1 and the second impedance value Z2, can be set as the input impedance Z of the output unit 120 of the vibration-driven energy harvesting device 100. However, a configuration may also be adopted in which a plurality of kinds of impedance values that is greater than two kinds can be set as the input impedance Z of the output unit 120. The plurality of kinds of impedance values may be configured as set values that can be continuously changed.

(3) In the embodiment described above, a configuration is adopted in which a condition under which a switching operation with respect to power transmission that is performed by the switching circuit 122 that the output unit 120 of the vibration-driven energy harvesting device 100 includes depends on the relation between the voltage V of direct-current power stored in the first power storage circuit 121 and the predetermined voltage value Vth, and by changing the predetermined voltage value Vth, the condition under which the switching operation with respect to the power transmission is performed is changed. However, a configuration may be adopted for which it is assumed that the switching circuit 122 periodically repeats performance of the switching operation with respect to the power transmission, and in which the condition under which the switching operation with respect to the power transmission is performed is changed by the control circuit that is included in the adjustment unit 150 changing a duty ratio based on a time period from when the power transmission is started until the power transmission is stopped, and a time period from when the power transmission is stopped until the power transmission is started.

Figure 6A:
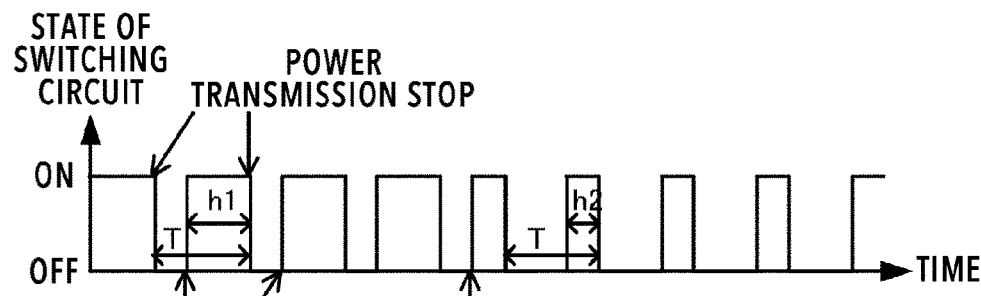
FIG. 6A is a view for describing another example of processing for adjusting the input impedance of the output unit of the vibration-driven energy harvesting device that is performed by the adjustment unit of the vibration-driven energy harvesting device.
Figure 6B:
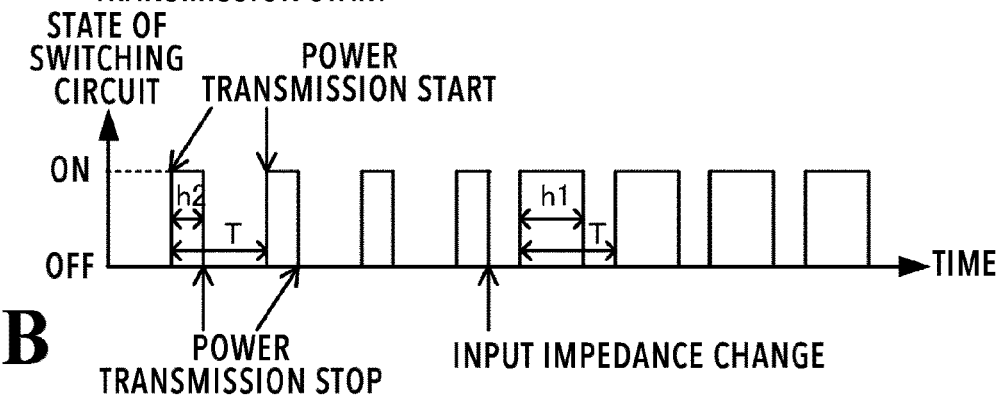
FIG. 6B is a view for describing another example of processing for adjusting the input impedance of the output unit of the vibration-driven energy harvesting device that is performed by the adjustment unit of the vibration-driven energy harvesting device.
Figure 6C:
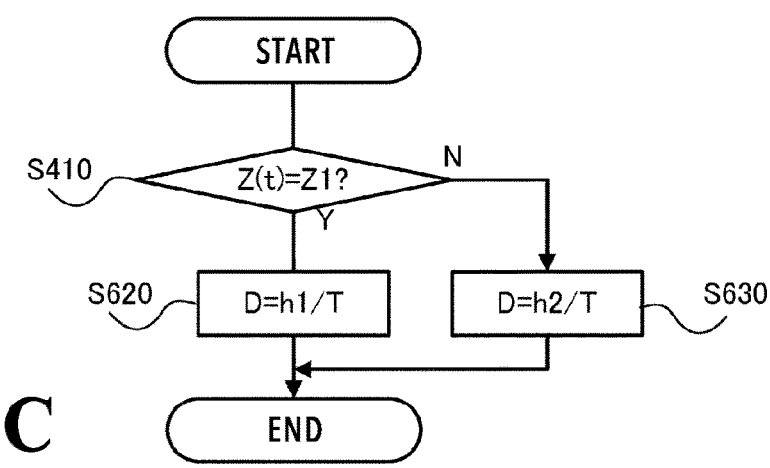
FIG. 6C is a view for describing another example of processing for adjusting the input impedance of the output unit of the vibration-driven energy harvesting device that is performed by the adjustment unit of the vibration-driven energy harvesting device.

FIG. 6A to FIG. 6C are views for describing another example of processing that adjusts the input impedance of the output unit of the vibration-driven energy harvesting device, that is performed by the adjustment unit 150 of the vibration-driven energy harvesting device. This input impedance adjustment processing is performed by the adjustment unit 150 of the vibration-driven energy harvesting device 100 in the present modification. As described above, the adjustment unit 150 includes a control circuit that controls switching operations of the switching circuit 122. As illustrated in FIG. 6A, in accordance with control by the adjustment unit 150, the switching circuit 122 periodically repeats, at a period T, a switching operation that changes from an OFF state to an ON state, and a switching operation that changes from an ON state to an OFF state in time series. When the switching circuit 122 changes to an ON state, power transmission from the first power storage circuit 121 to the second power storage circuit 123 is started, and when the switching circuit 122 changes to an OFF state, power transmission from the first power storage circuit 121 to the second power storage circuit 123 is stopped.

In FIG. 6A, initially, in the period T, a power transmission time period from when power transmission is started until the power transmission is stopped is a first time period h1, and hence a duty ratio D that is based on the period T and the first time period h1 is obtained by Equation (6). The duty ratio D is calculated by the adjustment unit 150.

$$D = h1/T \quad (6)$$

Next, in FIG. 6A, in a case where the adjustment unit 150 changed the input impedance Z based on the input impedance Z of the output unit 120 determined by the determination unit 140 of the vibration-driven energy harvesting device 100, in the period thereafter, in the period T, a power transmission time period from when power transmission is started until the power transmission is stopped is a second time period h2 that is smaller than the first time period h1, and therefore a duty ratio D based on the period T and the second time period h2 is obtained by Equation (7).

$$D = h2/T \quad (7)$$

That is, by changing the duty ratio D that is based on a power transmission time period from when power transmission from the first power storage circuit 121 to the second power storage circuit 123 is started until the power transmission is stopped, and a power stopped time period from when the power transmission is stopped until the power transmission is started, the adjustment unit 150 changes the condition under which the switching operation with respect to the power transmission is performed by the switching circuit 122. As illustrated in FIG. 6A, by the duty ratio D being changed from h1/T that is based on Equation (6) to a value h2/T which is based on Equation (7) and which is a smaller value than h1/T, the input impedance Z of the output unit 120 is changed from the first impedance value Z1 to the second impedance value Z2 that is larger than the first impedance value Z1.

As illustrated in FIG. 6B, by the duty ratio D being changed from the aforementioned value h2/T which is based on Equation (7) to the value h1/T which is based on Equation (6) and which is a larger value than h2/T, the input impedance Z of the output unit 120 is changed from the second impedance value Z2 to the first impedance value Z1 that is smaller than the second impedance value Z2.

The adjustment unit 150 changes the condition under which the switching operation with respect to the power transmission is performed by the switching circuit 122, according to the determination regarding the input impedance Z made by the determination unit 140 described above using FIG. 3 or FIG. 5. In the present modification, by changing the aforementioned duty ratio D, the adjustment unit 150 changes the condition under which the switching operation with respect to the power transmission is performed by the switching circuit 122, and adjusts the input impedance Z of the output unit 120 by changing that condition according to the determination regarding the input impedance Z made by the determination unit 140. Such processing for adjusting the input impedance Z that is performed by the adjustment unit 150 is illustrated in FIG. 6C.

The processing for adjusting the input impedance Z performed by the adjustment unit 150 that is illustrated in FIG. 6C is started at a time t at which the input impedance Z(t) is determined by the determination unit 140. In the processing for adjusting the input impedance Z illustrated in FIG. 6C, the processing in step S410 is common with the processing illustrated in FIG. 4C, and the subsequent processing in FIG. 6C differs from the processing in FIG. 4C in that the processing in steps S620 and S630 is performed instead of the processing in steps S420 and S430, respectively, in FIG. 4C. In step S410, the adjustment unit 150 judges whether or not the input impedance Z(t) determined by the determination unit 140 is the first impedance value Z1. If an affirmative judgment is obtained, the process proceeds to step S620, while if a negative judgment is obtained, the process proceeds to step S630.

In step S620, the adjustment unit 150 sets the value h1/T obtained using Equation (6) as the duty ratio D. When the duty ratio D=h1/T, the input impedance Z(t) of the output unit 120 becomes the first impedance value Z1. Upon completing step S620, the adjustment processing with respect to the input impedance Z at the time t ends.

In step S630, the adjustment unit 150 sets the value h2/T obtained using Equation (7) as the duty ratio D. When the duty ratio D=h2/T, the input impedance Z(t) of the output unit 120 becomes the second impedance value Z2. Upon completing step S630, the adjustment processing with respect to the input impedance Z at the time t ends.

In the vibration-driven energy harvesting device 100 according to the present modification, the control circuit included in the adjustment unit 150 can change the condition under which the switching operation with respect to the power transmission is performed by the switching circuit 122 by changing the duty ratio D which is based on a power transmission time period from when power transmission is started until the power transmission is stopped, and a power stopped time period from when the power transmission is stopped until the power transmission is started which are obtained by switching operations with respect to the power transmission being repeatedly performed by the switching circuit 122. In this case, an advantageous effect is obtained that it is easy for the control circuit to control switching operations with respect to power transmission performed by the switching circuit 122. Further, an advantageous effect is obtained such that since it is not necessary to measure a voltage V of direct-current power stored in the first power storage circuit 121, current loss that accompanies such a measurement can be prevented.

The present invention is not limited in any way to the configurations in the foregoing embodiment and respective modifications as long as the characteristic functions of the present invention are not impaired.

REFERENCE SIGNS LIST

100 Vibration-driven energy harvesting device
110 Vibration-driven energy harvesting element
120 Output unit
121 First power storage circuit
122 Switching circuit
123 Second power storage circuit
130 Judgment unit
140 Determination unit
150 Adjustment unit
200 Load resistor

The invention claimed is:

1. A vibration-driven energy harvesting device, comprising:
a vibration-driven energy harvesting element that generates power according to vibrations of an electrode;
an output unit that, when connected to a load resistor, extracts power generated by the vibration-driven energy harvesting element;
a judgment unit that judges whether or not a power value of the power is greater than a predetermined threshold value;
a determination unit that determines an input impedance of the output unit based on a judgment result obtained by the judgment unit; and
an adjustment unit that adjusts the input impedance of the output unit according to a determination made by the determination unit.

2. The vibration-driven energy harvesting device according to claim 1, wherein:
the determination unit determines either one of a first impedance value and a second impedance value that is different from the first impedance value as the input impedance, according to an index value that is calculated based on the judgment result; and
based on the judgment result at a first timing and the judgment result prior to the first timing, the determination unit calculates the index value at a second timing that is later than the first timing.

3. The vibration-driven energy harvesting device according to claim 2, wherein the determination unit:
based on the judgment result, calculates a first calculation value corresponding to the first impedance value, and a second calculation value corresponding to the second impedance value;
calculates the index value at the second timing based on a difference obtained by subtracting the first calculation value at the first timing from the second calculation value at the first timing;
determines the first impedance value as the input impedance in a case where the index value is less than a predetermined value; and
determines the second impedance value as the input impedance in a case where the index value is greater than the predetermined value.

4. The vibration-driven energy harvesting device according to claim 3, wherein:
when the input impedance at the first timing is the first impedance value,
in a case where the judgment unit judges that the power value is less than the predetermined threshold value, the first calculation value at the first timing is obtained by a first change amount being added to a first proportional value that is proportional to the first calculation value that is calculated prior to the first timing;
in a case where the judgment unit judges that the power value is greater than the predetermined threshold value, the first calculation value at the first timing is obtained by a second change amount being subtracted from the first proportional value that is proportional to the first calculation value that is calculated prior to the first timing; and
when the input impedance at the first timing is the second impedance value,
in a case where the judgment unit judges that the power value is greater than the predetermined threshold value, the second calculation value at the first timing is obtained by the first change amount being added to a second proportional value that is proportional to the second calculation value that is calculated prior to the first timing; and
in a case where the judgment unit judges that the power value is less than the predetermined threshold value, the second calculation value at the first timing is obtained by the second change amount being subtracted from the second proportional value that is proportional to the second calculation value that is calculated prior to the first timing.

5. The vibration-driven energy harvesting device according to claim 3, wherein:
when the input impedance is the first impedance value, the predetermined threshold value is a first threshold value;
when the input impedance is the second impedance value, the predetermined threshold value is a second threshold value that is different from the first threshold value; and
a specific power value corresponding to an inflection point where an increase in the power value according to an acceleration of the vibration at a time when the input impedance is the first impedance value slows down is greater than the first threshold value and is less than the second threshold value.

6. The vibration-driven energy harvesting device according to claim 1, wherein:
the output unit includes:
a first power storage circuit that converts alternating-current power which is output from the vibration-driven energy harvesting element to direct-current power and stores the direct-current power;
a second power storage circuit that converts a voltage of the direct-current power and stores the direct-current power; and
a switching circuit that performs a switching operation that starts or stops power transmission from the first power storage circuit to the second power storage circuit, and
the adjustment unit adjusts the input impedance by changing a condition under which the switching operation is performed.

7. The vibration-driven energy harvesting device according to claim 6, wherein:
when a voltage of the direct-current power that is stored in the first power storage circuit increases to a voltage value that is more than a predetermined voltage value or decreases to a voltage value that is less than the predetermined voltage value, the switching circuit performs the switching operation; and
the adjustment unit changes the condition under which the switching operation is performed by changing the predetermined voltage value.

8. The vibration-driven energy harvesting device according to claim 6, wherein:
the adjustment unit changes the condition under which the switching operation is performed by changing a duty ratio which is based on a time period from when the power transmission is started until the power transmission is stopped, and a time period from when the power transmission is stopped until the power transmission is started, which are obtained by the switching operation being repeatedly performed.

* * * * *